US010958037B2

(12) United States Patent
Choi et al.

(10) Patent No.: US 10,958,037 B2
(45) Date of Patent: Mar. 23, 2021

(54) LASER ARRANGEMENT AND METHOD FOR PRODUCING A LASER ARRANGEMENT

(71) Applicant: FRAUNHOFER-GESELLSCHAFT ZUR FÖRDERUNG DER ANGEWANDTEN FORSCHUNG E.V., Munich (DE)

(72) Inventors: Jung Han Choi, Berlin (DE); Heinz-Gunter Bach, Berlin (DE); Lei Yan, Berlin (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 16/467,958

(22) PCT Filed: Dec. 7, 2017

(86) PCT No.: PCT/EP2017/081836
§ 371 (c)(1),
(2) Date: Jun. 8, 2019

(87) PCT Pub. No.: WO2018/104456
PCT Pub. Date: Jun. 14, 2018

(65) Prior Publication Data
US 2020/0076159 A1    Mar. 5, 2020

(30) Foreign Application Priority Data

Dec. 9, 2016 (DE) .................... 10 2016 224 621.4
Jan. 26, 2017 (DE) .................... 10 2017 201 285.6

(51) Int. Cl.
*H01S 5/042* (2006.01)
*H01S 5/024* (2006.01)
(Continued)

(52) U.S. Cl.
CPC .......... *H01S 5/0427* (2013.01); *H01S 5/0261* (2013.01); *H01S 5/02415* (2013.01);
(Continued)

(58) Field of Classification Search
CPC ............. H01S 5/06255; H01S 5/02415; H01S 5/0261; H01S 5/0427; H01S 5/4025;
(Continued)

(56) References Cited

U.S. PATENT DOCUMENTS 6,002,699 A   12/1999 Gotoh
6,014,392 A    1/2000 Imai et al.
(Continued)

FOREIGN PATENT DOCUMENTS

CN   101702489 A   5/2010
CN   102593712 A   7/2012
(Continued)

OTHER PUBLICATIONS

Yamazaki et al. "PDM-QPSK Modulator With a Hybrid Configuration of Silica PLCs and LiNbO3 Phase Modulators." Journal of Lightwave Technology, vol. 29, No. 5, Mar. 1, 2011, 721-727.
(Continued)

*Primary Examiner* — Xinning(Tom) Niu
(74) *Attorney, Agent, or Firm* — Maschoff Brennan (57) ABSTRACT

It is provided a laser arrangement, having an electro-absorption-modulated laser, having a laser section and an electro-absorption modulator section; a current source for supplying the laser section with current; a DC voltage source that is arranged in addition to the current source and can be used to apply DC voltage to a diode structure of the electro-absorption modulator section; a driver with which an RF signal is able to be fed to the laser; and an electrical connection via which the driver is connected to the laser. The electrical connection provides a direct current connection between the
(Continued)

driver and the laser such, and the driver is configured such, that a photocurrent that is generated in the electrode-absorption modulator section of the laser by illumination with light of the laser section at least partially flows to the driver and at least contributes to the energy supply of the driver.

20 Claims, 10 Drawing Sheets

(51) Int. Cl.
  *H01S 5/026* (2006.01)
  *H01S 5/0625* (2006.01)
  *H01S 5/40* (2006.01)
  *H01S 5/022* (2021.01)
(52) U.S. Cl.
  CPC ........ *H01S 5/06255* (2013.01); *H01S 5/4025* (2013.01); *H01S 5/0224* (2013.01)
(58) Field of Classification Search
  CPC .............. H01S 5/0224; H01S 5/04256; H01S 5/02276; H01S 5/0265; H01S 5/06226; G02F 1/17; G02F 1/0121; G02F 2001/0157
  See application file for complete search history.

(56) References Cited

U.S. PATENT DOCUMENTS

| | | | | |
|---|---|---|---|---|
| 6,567,439 | B1* | 5/2003 | Auracher | H01L 24/49 372/36 |
| 6,707,589 | B2 | 3/2004 | Bostak et al. | |
| 6,970,515 | B1* | 11/2005 | Bicakci | H04L 25/0278 370/321 |
| 7,194,012 | B2 | 3/2007 | Mason et al. | |
| 9,116,367 | B2 | 8/2015 | Tatsumi et al. | |
| 2002/0141679 | A1 | 10/2002 | Dol et al. | |
| 2003/0095736 | A1* | 5/2003 | Kish, Jr. | G02B 6/12007 385/14 |
| 2004/0028099 | A1* | 2/2004 | Hongo | G02F 1/0123 372/38.02 |
| 2004/0264535 | A1 | 12/2004 | Svenson | |
| 2004/0264973 | A1 | 12/2004 | Bremner et al. | |
| 2005/0140453 | A1* | 6/2005 | Shapiro | H03F 3/08 330/308 |
| 2007/0183790 | A1 | 8/2007 | Matsumoto | |
| 2012/0162743 | A1 | 6/2012 | Okada | |
| 2012/0269215 | A1 | 10/2012 | Lv | |
| 2013/0016745 | A1 | 1/2013 | Moto | |
| 2016/0202501 | A1 | 7/2016 | Bach et al. | |
| 2017/0338896 | A1 | 11/2017 | Zhang et al. | |

FOREIGN PATENT DOCUMENTS

| | | |
|---|---|---|
| CN | 103050887 A | 4/2013 |
| CN | 103094835 A | 5/2013 |
| CN | 103888190 A | 6/2014 |
| CN | 104865714 A | 8/2015 |
| CN | 106059673 A | 10/2016 |
| DE | 102013218859 B3 | 2/2015 |
| EP | 0753782 B1 | 10/2000 |
| JP | 2011044753 A | 3/2011 |
| JP | 2014041878 A | 3/2014 |
| JP | 5666415 B2 | 2/2015 |

OTHER PUBLICATIONS

Chelles et al. "Efficient polarization insensitive electroabsorption modulator using strained InGaAsP-based quantum wells." Applied Physics Letters 64, 3530 (1994) 3530-3532.
AVAGO Technologies, "Application Note 5359." 2010.
Tatsumi et al. "1.3 µm, 56-Gbit/s EML Module target to 400GbE," Optical Fiber Communication Conference, OSA Technical Digest (Optical Society of America, 2012), paper OTh3F.4.
Zhu Longde et al. "GaAs/GaAlAs Single Quantum Well Electroabsorption and Light Modulation," Chinese Journal of Semiconductors, vol. 11, No. 3, Mar. 31, 1990, pp. 202-209.
Fu, E. et al. Monolithic ultra-low-power 6 Gbit/s inductorless PRBS generator for silicon HBT-based carrier-injection electro-absorption modulator, Electronics Letters, vol. 51, No. 12 Jun. 11, 2015, pp. 921-922.
CN Office Action in Application No. 201780076140.9 dated Aug. 21, 2020.

* cited by examiner

LASER ARRANGEMENT AND METHOD FOR PRODUCING A LASER ARRANGEMENT

CROSS-REFERENCE TO A RELATED APPLICATION

This application is a National Phase Patent Application of International Patent Application Number PCT/EP2017/081836, filed on Dec. 7, 2017, which claims priority of German Patent Application Number 10 2017 201 285.4, filed on Jan. 26, 2017.

BACKGROUND

The disclosure relates to a laser arrangement and to a method for producing a laser arrangement.

Such a laser arrangement includes an electro-absorption-modulated laser (EML), that is to say a laser having a laser section for generating laser radiation and an electro-absorption modulator section for modulating the laser radiation generated in the laser section. Laser arrangement having an EML is disclosed for example in U.S. Pat. No. 9,116,367 B2.

SUMMARY

The proposed solution is based on the object of operating a laser arrangement having an EML as energy-efficiently as possible.

This object is achieved by the provision of the laser arrangement having features as described herein and by the provision of the method as described herein.

Accordingly, provision is made for a laser arrangement, comprising
- an electro-absorption-modulated laser (EML), having a laser section and an electro-absorption modulator section;
- a current source for supplying the laser section with current;
- a DC voltage source that is arranged in addition to the current source and can be used to apply DC voltage to a diode structure of the electro-absorption modulator section;
- a driver with which an RF signal is able to be fed to the laser;
- an electrical connection via which the driver is connected to the laser, wherein,
- the electrical connection provides a direct current connection, that is to say DC coupling, between the driver and the laser such, and the driver is configured such, that a photocurrent that is generated in the electrode-absorption modulator section of the laser by illumination with light of the laser section at least partially flows to the driver and at least contributes to the energy supply of the driver.

The laser arrangement according to the proposed solution thus utilizes the photocurrent that is produced during the operation of the laser and would otherwise go unused, as a result of which the energy that is to be supplied to the driver from the outside is reduced or no additional energy at all need be supplied to the driver. The laser arrangement according to the solution can be used to realize in particular an energy-efficient optical transmitter.

According to a configuration of the solution, the electrical connection also provides an RF connection between the driver and the laser, that is to say a connection via which a radio-frequency signal is able to be transmitted from the driver to the laser. In particular, the electrical connection can be an impedance-adapted line; for example a line the impedance of which is adapted to an output impedance of the driver and/or an impedance of the laser. The driver in particular comprises a driver circuit, which in turn has at least one amplifier.

The photocurrent that is at least partially used to supply the driver is produced during the illumination of the electro-absorption modulator section of the laser with light which is generated in the laser section of the laser.

The driver may be a single-ended (and consequently in particular not a differential) amplifier. The RF signal is able to be supplied to the driver in particular by virtue of a temporally varying potential being applied to an input of the driver, wherein the RF signal is produced as difference of the varying potential with a temporally substantially constant reference potential. It is conceivable that the reference potential (e.g. a ground potential) is applied to a further input of the driver. However, the proposed solution is not limited to a single-ended amplifier as the driver. Also conceivable is that the driver comprises another driver circuit; for example a driver circuit that makes differential operation possible.

It is in particular conceivable that the driver is configured such, and connected to the laser such, that the driver is able to be supplied with energy exclusively by way of the photocurrent generated in the electro-absorption modulator section of the laser (via the direct current connection). It is additionally possible for a current generated by the current source to at least substantially not flow into the driver.

The driver may configured such, and connected to the laser such, that the driver retains its amplification properties at least substantially even if it is supplied with energy exclusively by way of the photocurrent generated in the electro-absorption modulator section of the laser; that is to say in particular in the case that a direct current supply of the driver is effected exclusively via the direct current connection and for example exclusively via an RF output of the driver that is coupled to the direct current connection.

Moreover, it is possible that no electrical connection exists between the current source and the electro-absorption modulator section or that an electrical connection which at least substantially does not carry current during the operation of the laser arrangement, for example exclusively via at least one doped (in particular n-doped) semiconductor layer of the laser, is formed. In particular, there is no electrical connection between the current source and the driver (aside from a possible non-current-carrying connection, for example via the doped semiconductor layer). As a consequence, there is no flow of current from the current source of the laser section into the driver. Moreover, it is also possible for no electrical connection to exist between the direct voltage source and the laser section or a currentless electrical connection is formed, in particular exclusively via at least one doped semiconductor layer of the laser.

This (in particular strict) electrical separation of the laser section and the electrode-absorption modulator section also in particular comprises a separation of a circuit of the laser arrangement, formed for operating the laser section, and a circuit provided for applying a modulation signal to the electro-absorption modulator section. With such a separation of the circuits, disturbing couplings between the circuits can be avoided, as a result of which the creation of an optical chirp may counteracted.

In addition, stable voltage supply and/or operating point adjustment of the electro-absorption modulator section may be possible with the aid of the voltage source, without influencing the operation of the laser section. Moreover, the electrical separation of the current source of the laser section from the driver makes possible a current supply of the driver exclusively or at least substantially exclusively with the photocurrent generated in the electro-absorption modulator section and thus a particularly energy-saving operation of the laser.

It is conceivable, as already mentioned above, that the energy supply of the driver is effected mainly by way of the photocurrent generated in the electro-absorption modulator section of the laser. It is consequently possible that a separate voltage source for supplying the driver is present, via which, in addition to the photocurrent, electrical energy is supplied to the driver. However, it is also conceivable that the energy supply of the driver is effected at least substantially solely by way of the photocurrent generated in the laser, and the voltage source for supplying the driver may omitted. Accordingly, an (expensive, RF-critical and space-occupying) RF decoupling coil, via which an external voltage supply is coupled into the driver, can be dispensed with. Dispensing with the RF decoupling coil can be beneficial due to the lower space requirement in the case of an array having a plurality of laser arrangements according to the solution.

According to another development of the proposed solution, the laser arrangement is configured such that at least substantially the entire photocurrent generated in the electro-absorption modulator section of the laser is used for the energy supply of the driver. In accordance with this variant, substantially the entire photocurrent generated in the EML is thus supplied to the driver via the direct current connection. However, it is certainly also conceivable that only part of the photo current flows into the driver and another part of the photo current may used to supply a further consumer of the laser arrangement or drained via a resistance.

In accordance with a further embodiment, the driver is a traveling wave amplifier (TWA), wherein the photocurrent is fed to in particular amplified transistors of the traveling wave amplifier. The individual amplifiers (transistors) may configured in a single-ended configuration and are accordingly may operated non-differentially. However, the solution is not limited to a specific configuration of the driver. Rather, in principle any desired suitable driver (in particular amplifier circuits) can be used. Suitable drivers may be configured such, and connected to the laser such, that the driver retains its amplification properties if it is supplied with energy exclusively by way of the photocurrent generated in the electro-absorption modulator section of the laser, as already explained above.

It is also possible for the laser arrangement according to the solution to have an impedance adaptation circuit having adaptation inductance, adaptation resistance and/or direct current blocking capacitance (realized for example by a DC blocking capacitance). The DC blocking capacitance counteracts, in particular in the case of a voltage supply of the driver, in addition to the energy supply by way of the photocurrent, a DC power loss, in particular a termination impedance of the driver. However, it is also conceivable that the impedance adaptation circuit has no DC blocking capacitance.

The impedance adaptation circuit may be part of the laser and formed by the electro-absorption modulator section, or connected thereto; in particular, the impedance adaptation circuit is coupled to a diode structure of the electro-absorption modulator section. However, it is also conceivable that the impedance adaptation circuit is integrated in the electrical connection between the driver and the EML; in particular, the impedance adaptation circuit is a constituent part of a flexible line forming the electrical connection. By moving the impedance adaptation circuit into the electrical connection, the production of the electro-absorption modulator section of the laser can be simplified. It may be conceivable that, during the production of an array having a plurality of laser arrangements according to the solution, the impedance adaptation circuits have been moved into the respective electrical connection.

Moreover, the driver, the electrical connection and the laser of the laser arrangement according to the solution can be integrated monolithically, that is to say these elements are formed in particular on a common substrate. Monolithic integration can be realized with InP-, GaAs-, SiGe-, SiP-CMOS-technology or similar technology. For example, due to the reduced energy consumption of the laser arrangement according to the solution, thermal decoupling of the driver and of the EML is not absolutely necessary here.

However, also conceivable is a hybrid construction, in which the driver and the EML are arranged on separate substrates and are connected to one another in particular via a likewise separately configured electrical connection; for example via a "flexline," explained in more detail below.

It is also possible that the laser arrangement according to the solution has a DC voltage source via which DC voltage can be applied to an active region of the electro-absorption modulator section. The DC voltage source serves for example for applying a reverse voltage to a diode structure of the electro-absorption modulator section of the EML.

In accordance with another development of the solution, the electrical connection is configured via a flexible line. The flexible line may be a "flexline," that is to say a flexible line having a dielectric flexible carrier material, on which a plurality of (in particular metallic) lines (for example in the form of conductor tracks) is arranged. The flexible line may have a polymer (such as a polyimide) as the carrier material. The flexible line may configured as a co-planar microstrip.

Connection of the driver to the laser is possible with the aid of the flexible line even in the case of a greater distance between said components, with the result that the driver can be arranged at a distance from the laser so as to realize best possible thermal decoupling of the driver and the laser from one another. The connection of the flexible line (or any other line that forms the electrical connection) to the driver and/or the laser may be effected via flip chip bonding.

In accordance with another development of the solution, the laser arrangement comprises a thermoelectric cooling apparatus for cooling the electro-absorption-modulated laser, in particular to keep the temperature of the laser (in particular of the electro-absorption modulator section) as constant as possible. The EML may be arranged on the thermoelectric cooling apparatus.

However, it should be pointed out that the laser arrangement according to the solution does not necessarily require a cooling apparatus due to the use of the photocurrent which otherwise contributes to the heating of the laser. Neither is it necessary for a greater distance between the driver and the laser to be provided. Rather, monolithic integration is also possible, as already explained above.

As has already been indicated above, the solution can also relate to an array having a plurality of laser arrangements according to the solution, for example an array having 2, 4, 8, . . . laser arrangements (channels).

The solution also relates to a method for producing a laser arrangement, in particular a laser arrangement configured as described above, wherein the method includes the steps of:

providing an electro-absorption-modulated laser, having a laser section and an electro-absorption modulator section;

providing a current source for supplying the laser section with current and an additional DC voltage source that is arranged in addition to the current source and can be used to apply DC voltage to a diode structure of the electro-absorption modulator section;

providing a driver with which an RF signal is able to be fed to the laser;

producing an electrical connection between the driver and the laser, wherein the laser arrangement is configured such that the electrical connection provides a direct current connection between the driver and the laser such that a photocurrent that is generated in the electrode-absorption modulator section of the laser by illumination with light of the laser section at least partially flows to the driver and at least contributes to the energy supply of the driver.

Providing the electro-absorption-modulated laser and/or the driver in particular also comprises producing the laser and/or the driver. Moreover, the embodiments described above in connection with the laser arrangement according to the solution can of course be similarly used for developing the method according to the solution further.

BRIEF DESCRIPTION OF THE DRAWINGS

The proposed solution will be explained in more detail below on the basis of embodiments with reference to the figures.

DETAILED DESCRIPTION

Figure 1:
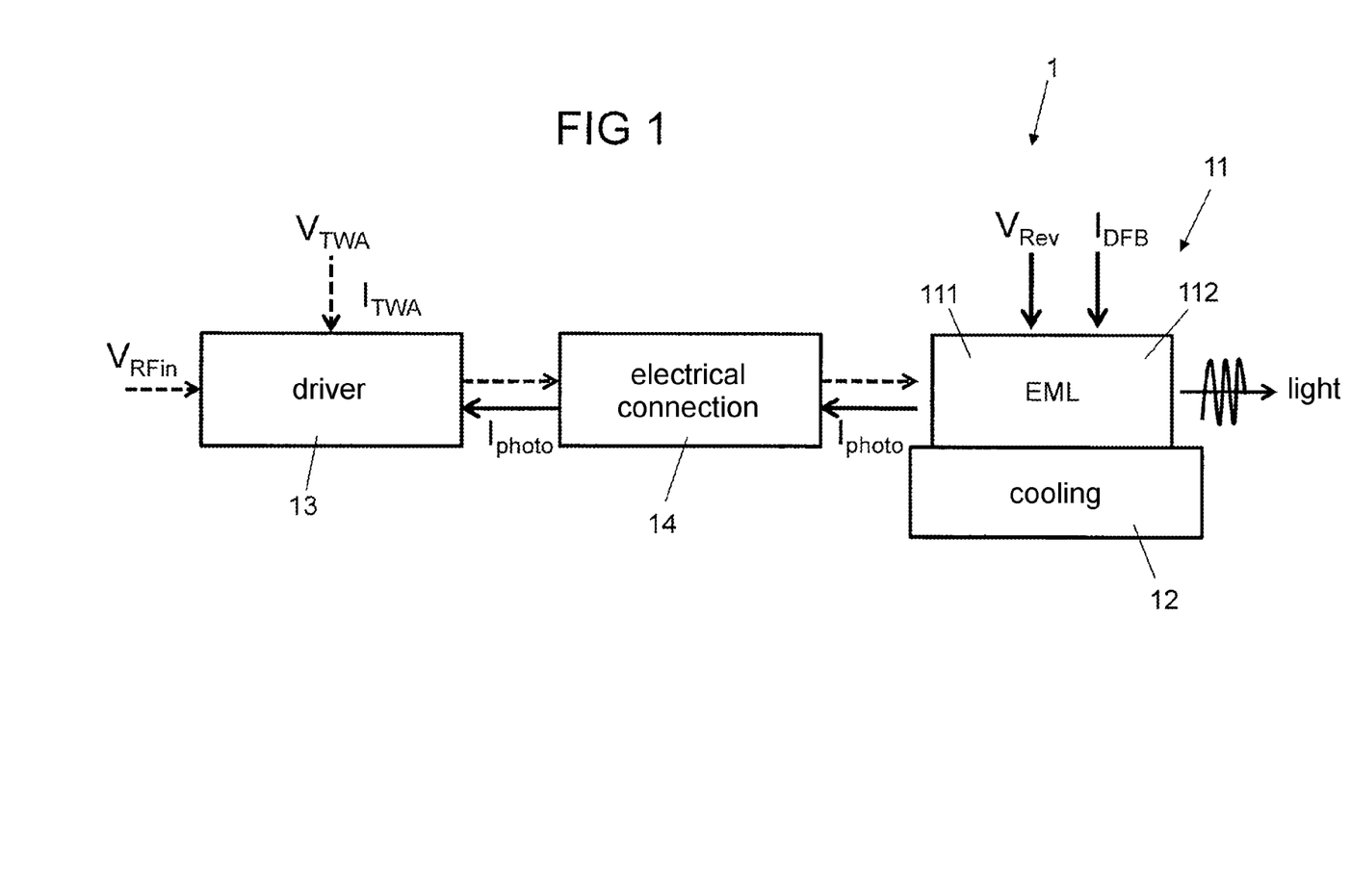
FIG. 1 schematically shows a laser arrangement according to a first embodiment.

The laser arrangement 1 according to the proposed solution, illustrated in FIG. 1, comprises an electro-absorption-modulated laser (EML) 11, having a laser section 111 (for example in the form of a DFB or DBR laser) and an electro-absorption modulator section 112. A (for example thermoelectric) cooling apparatus 12 on which the laser 11 is arranged can be provided for cooling said laser 11. According apparatus 12, however, is merely optional.

For actuating the laser 11, in particular for transmitting an RF signal, the laser arrangement 1 comprises a driver 13, in particular in the form of a traveling wave amplifier (TWA). The driver 13 in particular serves for amplifying a radio-frequency input signal $V_{RFin}$ and for feeding the amplified RF signal to the laser 11 via an electrical connection 14.

The electrical connection 14 not only realizes an RF connection between the driver 13 and the laser 11, but at the same time provides a direct current connection between the driver 13 and the laser 11. Moreover, the laser arrangement 1 is configured such that a photocurrent $I_{photo}$ generated in the electro-absorption modulator section 112 of the laser 11 upon irradiation with light of the laser section 111 at least partially flows into the driver 13 via the electrical connection 14 and at least contributes to the energy supply of the driver 13.

It is in particular conceivable that the energy supply of the driver 13 is effected exclusively by way of the photocurrent $I_{photo}$. However, it is also possible that an additional supply voltage $V_{TWA}$ is supplied to the driver 13 via a voltage source. In particular, the driver 13 is configured such that it makes possible both energy supply exclusively by way of the photocurrent $I_{photo}$ and with the additional supply voltage $V_{TWA}$.

Figure 2:
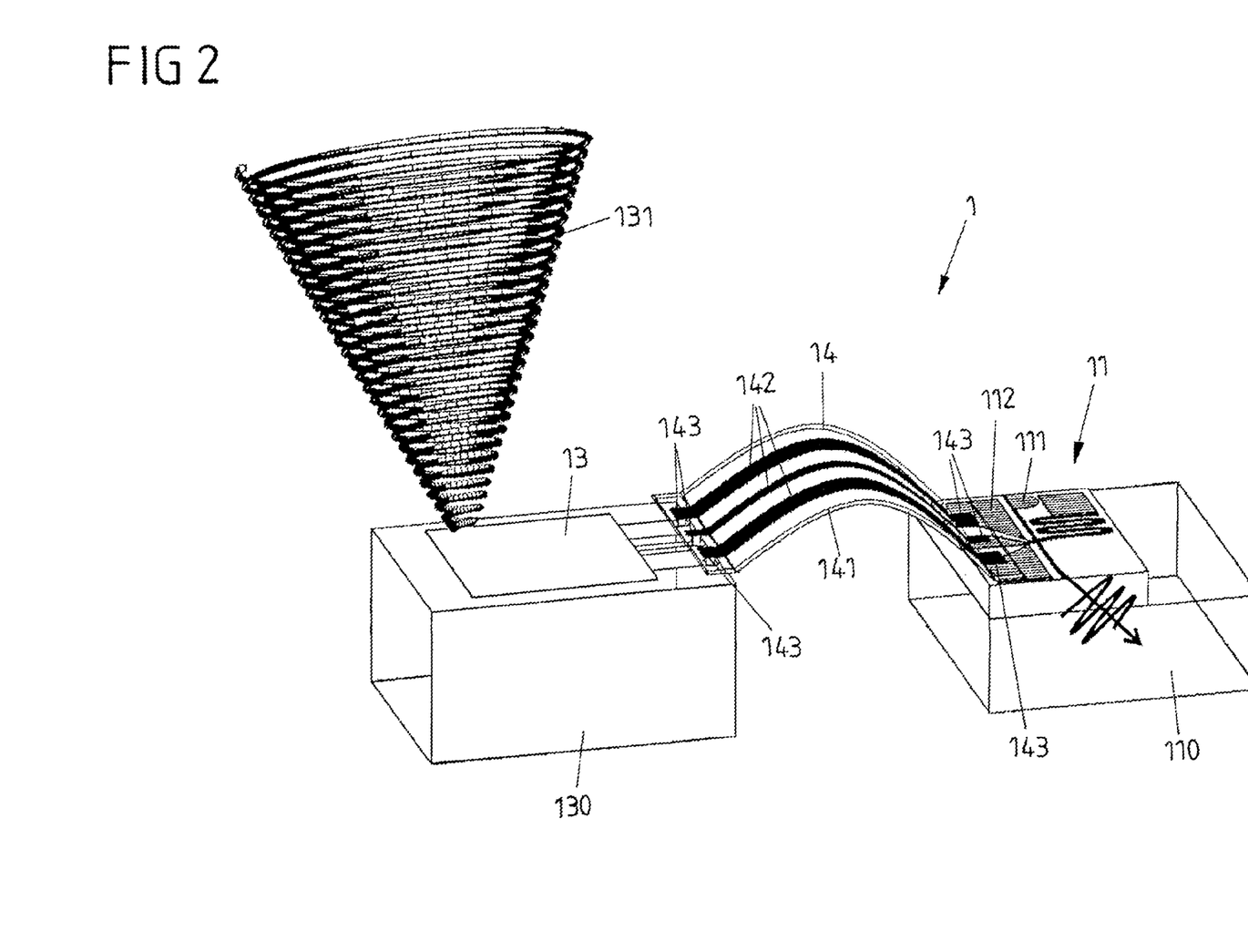
FIG. 2 shows a perspective view of a laser arrangement according to a second embodiment.

A possible hybrid configuration of the laser arrangement 1 according to the solution is illustrated in FIG. 2. Here, the driver 13 is arranged as an integrated circuit on a first substrate 130, while the EML 11 is formed as a semiconductor structure on a separate, second substrate 110.

The driver 13 and the EML 11 are coupled to one another via a likewise separate electrical connection 14, wherein the electrical connection 14 has the form of a flexible line, that is to say a line comprising a plurality of conductor tracks 142 which are arranged on a flexible substrate 141. The conductor tracks 142 are connected via contacts (bumps) 143 to output lines of the driver 13 or input lines of the laser 11.

The driver 13 is additionally coupled to a broadband termination coil (decoupling coil) 131, via which a supply voltage is able to be supplied to the driver 13. The supply voltage is made available in addition to the supply by way of the photocurrent of the laser 11 supplied via the electrical connection 14. Such an additional voltage supply and consequently also the termination coil 131, however, are merely optional.

Figure 3:
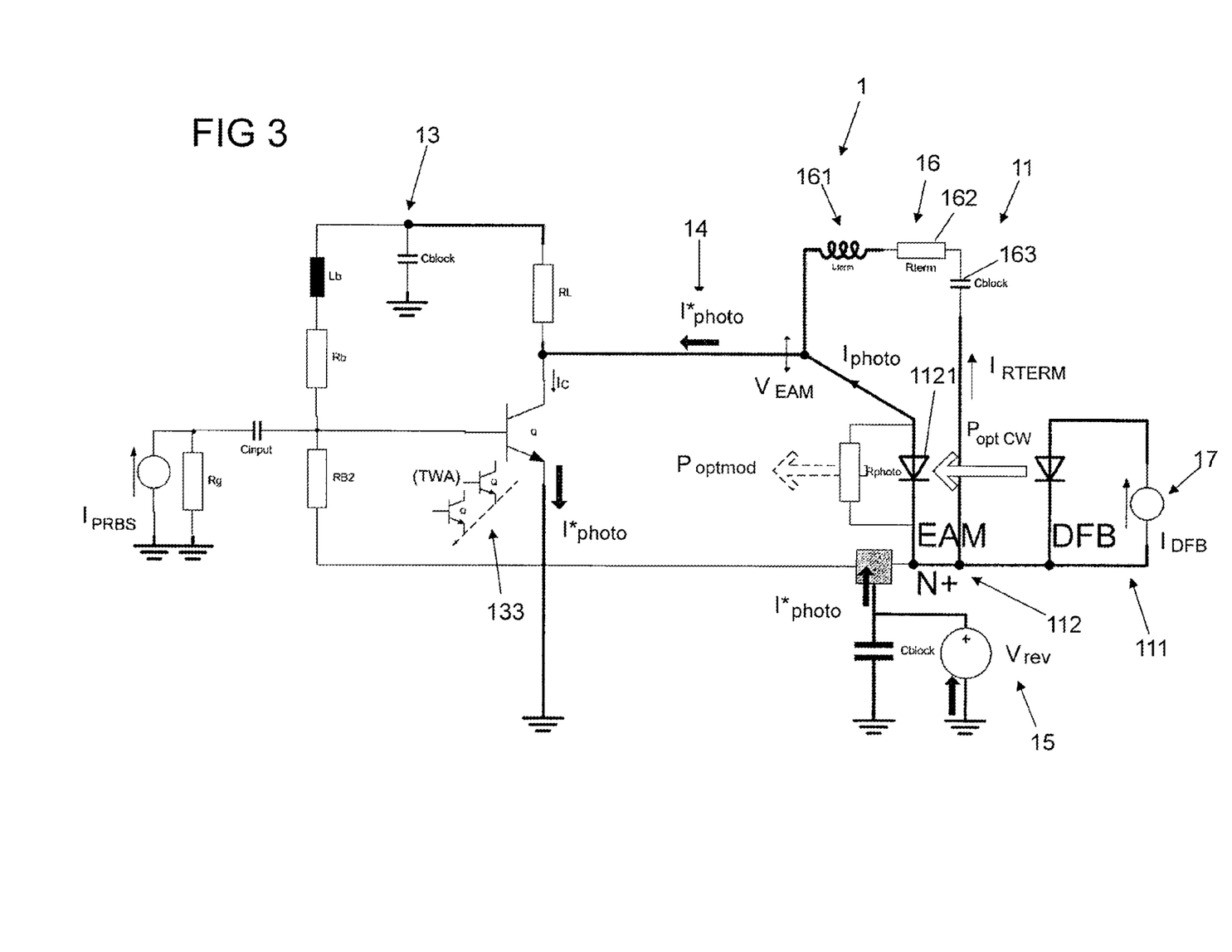
FIG. 3 shows a circuit diagram of a laser arrangement according to a third embodiment.

FIG. 3 shows a circuit diagram of a further embodiment of the laser arrangement 1 according to the solution. Accordingly, the laser arrangement 1 additionally has a DC voltage source 15, via which DC voltage (reverse voltage $V_{rev}$) can be applied to a diode structure 1121 of the electro-absorption modulator section 112 of the laser 11. In addition, a current source 17 for supplying the laser section 111 with current (supply current $I_{DFB}$) is provided.

However, a separate voltage supply of the driver 13 was dispensed with, that is to say the energy for operating the driver 13 is made available solely by the DC current $I^*_{photo}$ that is supplied via the electrical connection 14 from the laser 11, such that the only energy sources required for operating the laser arrangement 1 are the DC voltage source 15 and the current source 17.

The continuous light radiation ($P_{optCW}$) generated by the laser section 111 is modulated using the diode structure 1121 and in dependence on the RF voltage supplied to the laser 11 via the driver 13, wherein the EML emits modulated radiation ($P_{optmod}$) and the photocurrent $I_{photo}$ is produced in the electro-absorption modulator section 112. The photocurrent $I_{photo}$ is supplied to the driver 13, as already explained above, via the electrical connection 14, specifically in particular the amplification transistors 133 (TWA) thereof.

The laser arrangement 1 furthermore comprises an impedance adaptation circuit 16 for adapting in particular the impedance of the electro-absorption modulator section 112 of the laser 11 to the impedance of the connection 14 and of the driver 13 to keep reflections of the driver signal as low as possible. The impedance adaptation circuit 16 in the embodiment of FIG. 3 is correspondingly configured as a termination impedance circuit of the laser 11 and comprises an adaptation inductance 161 ("$L_{term}$"), an adaptation resistance 162 (termination resistance $R_{term}$) and a direct current blocking capacitance 163 ("$C_{block}$"). The adaptation inductance 161, the adaptation resistance 162 and the direct current blocking capacitance 163 are connected in series.

The direct current blocking capacitance 163 in particular prevents draining of a part of the photocurrent $I_{photo}$ and of a current $I_{RTERM}$ originating from the voltage source 15 via the termination resistance $R_{term}$. Accordingly, the driver 13 is fed at least substantially by way of the direct current $I^*_{photo}$ flowing from the laser 11 to the driver 13, wherein here the direct current $I^*_{photo}$ flowing to the driver 13 corresponds to the photocurrent $I_{photo}$ generated (that is to say, $I^*_{photo}=I_{photo}$).

Figure 4:
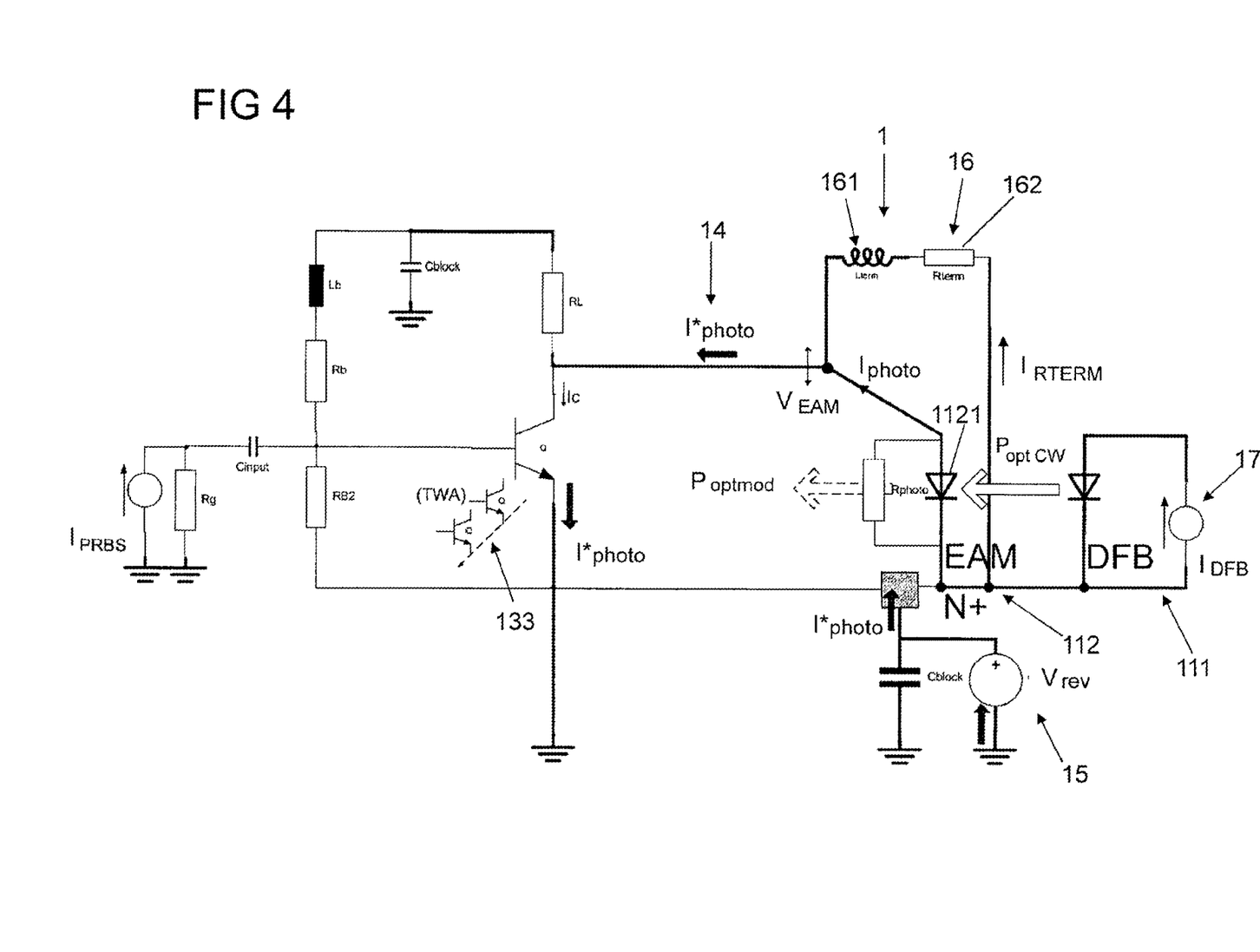
FIG. 4 shows a variant of the laser arrangement from FIG. 3.

Also conceivable is that the direct current blocking capacitance 163 is dispensed with and replaced by a short circuit, as a result of which production of the impedance adaptation circuit can be simplified. This variant is illustrated in FIG. 4. In this case, the direct current $I_{RTERM}$ together with the photocurrent $I_{photo}$ generated in the electrode-absorption modulator section 112 will flow to the driver 13 such that, for the current $I^*_{photo}$ supplied to the driver 13: $I^*_{photo}=I_{photo}+I_{RTERM}$.

Figure 5:
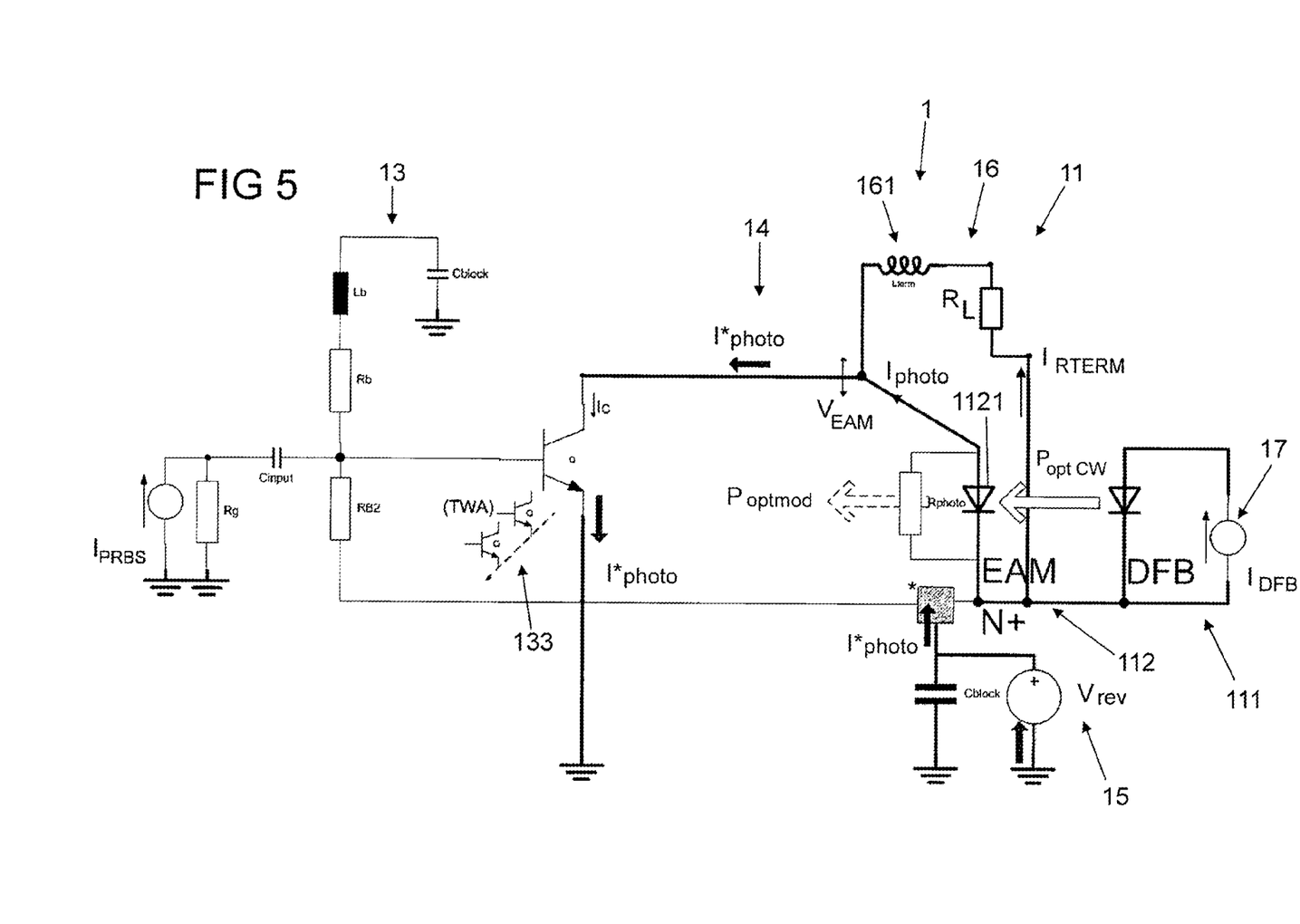
FIG. 5 shows a further variant of the laser arrangement from FIG. 3.

It is also conceivable that the termination resistance $R_{term}$ replaces the output resistance ("pull-up" resistance) $R_L$ of the driver 13 (in particular in a monolithic configuration of the laser arrangement 1) and the driver 13 is supplied in supplementation of the photocurrent from the electro-absorption modulator section 112 via the termination resistance $R_{term}$ ($=R_L$). The driver-side resistance $R_L$ on the transistor Q is dispensed with ("open-collector" driver configuration), as is shown in FIG. 5. As a result, in particular the construction of the base potential divider (comprising the resistances RB2 and Rb) which is supplied with a low current of the voltage source 15 ($V_{rev}$) is simplified; in particular by virtue of the fact that the inductance Lb which is series-connected with the resistance Rb is now immediately grounded. Via a capacitance $C_{input}$ and a resistance $R_g$ and the base potential divider, a modulated radio-frequency input current $I_{PRBS}$ is supplied to the transistors 133.

Figure 6:
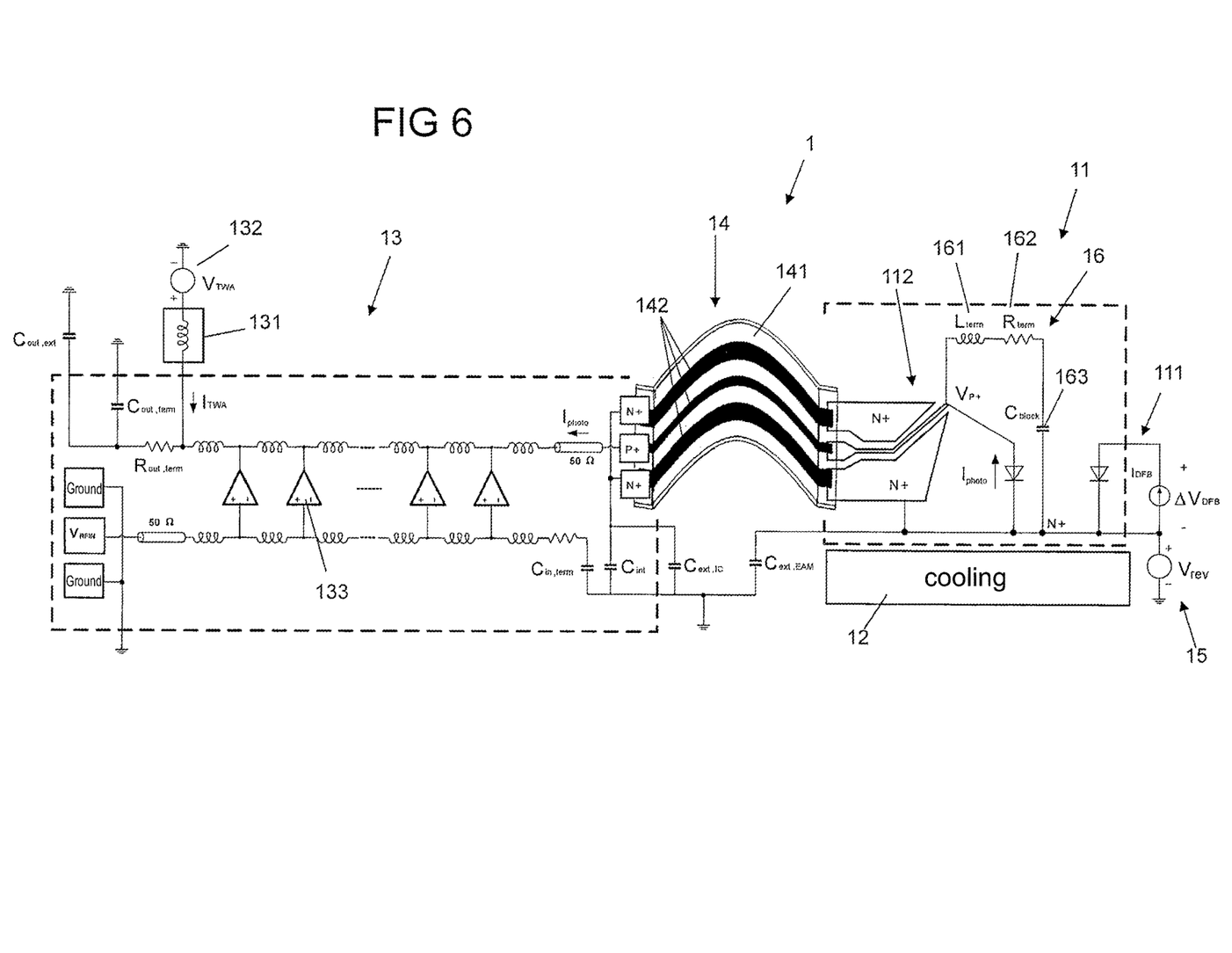
FIG. 6 shows a circuit diagram of a laser arrangement according to a fourth embodiment.

FIG. 6 shows a circuit diagram of a laser arrangement 1 according to the solution, which is configured similar to the embodiment of FIG. 3, but wherein further details of the driver 13, in the form of a traveling wave amplifier, are illustrated. Likewise similarly to FIG. 3, the laser arrangement of FIG. 6 comprises an impedance adaptation circuit 16, which is formed as a termination impedance circuit of the electro-absorption modulator section 112 of the laser 11.

Furthermore, the electrical line 14 is in the form of a flexible line with a flexible substrate 141 and conductor tracks 142 arranged thereon. The driver 13 can additionally be supplied via a voltage source 132 (supply voltage $V_{TWA}$) and an RF termination coil 131. By using the photocurrent $I_{photo}$, which, as explained above, corresponds to the direct current $I^*_{photo}$ that is actually flowing to the driver 13 due to the existing blocking capacitance 163, an energy saving during operation of the driver 13 of $V_{TWA} \times I_{photo}$ is achieved.

The traveling wave amplifier in particular has more than one amplifier stage. Traveling wave amplifiers per se are known, however, and further explanations will therefore not be provided. However, it should be pointed out that the solution is not limited to the use of traveling wave amplifiers. An amplifier having only one amplifier stage could be used as the driver.

Furthermore, FIG. 6 shows capacitances $C_{in,term}$, $C_{ext,EAM}$, $C_{int}$ and $C_{ext,IC}$, via which an RF ground connection of the laser arrangement 1 (of the driver 13 and of the electro-absorption modulator section 112) is effected, wherein draining of the photocurrent $I_{photo}$ to ground is prevented, however. On the output side with respect to the returning waves, the driver 13, to which an input signal $V_{RFIN}$ is supplied, comprises a termination network with a resistance $R_{out,term}$ and capacitances $C_{out,term}$, $C_{out,ext}$. For the rest, reference is made to the explanations in relation to FIG. 4.

Figure 7:
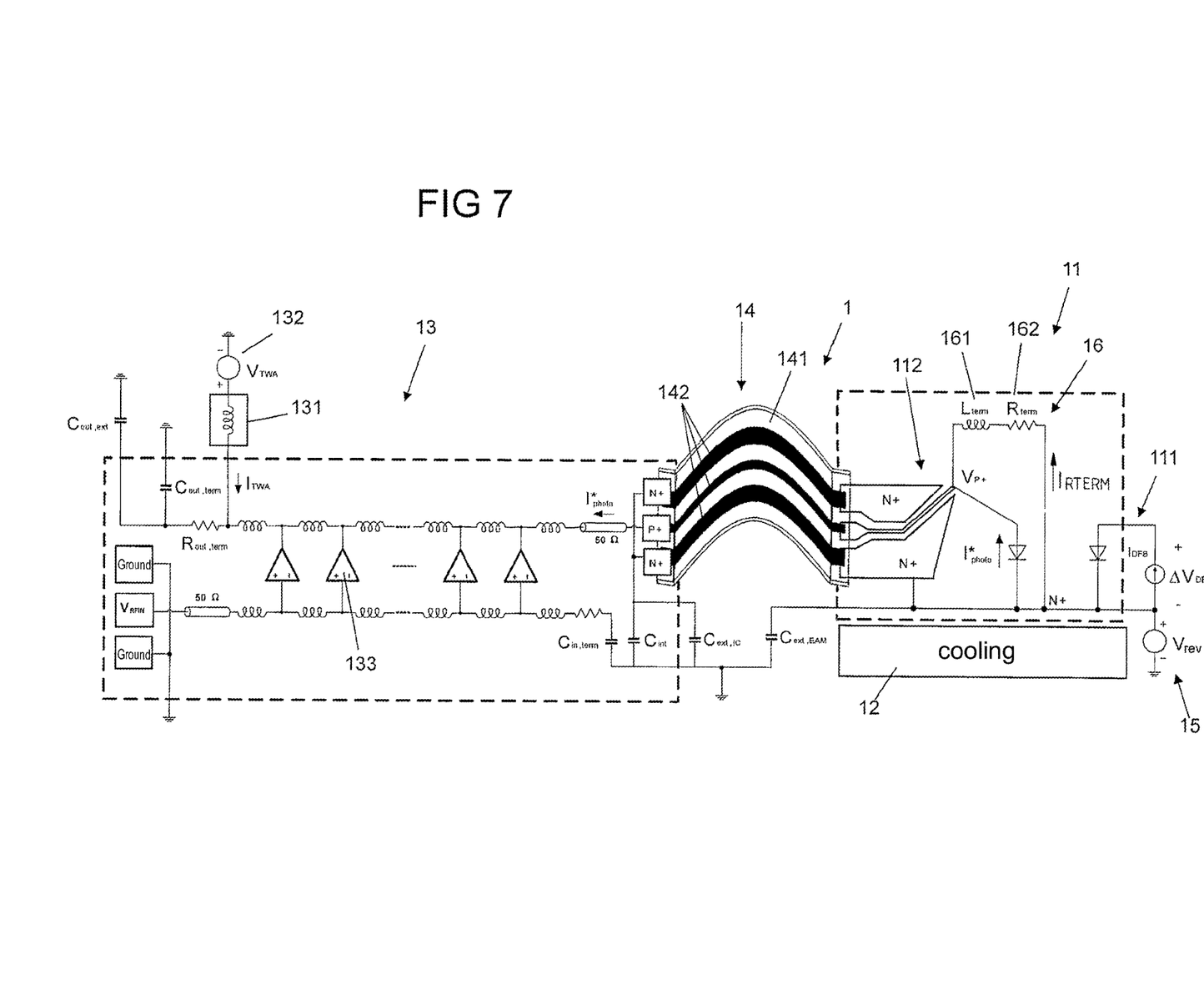
FIG. 7 shows a variant of the laser arrangement from FIG. 6.

FIG. 7 shows a variant of FIG. 6, which is similar to FIG. 4 and according to which the impedance adaptation circuit 16 is formed without the direct current blocking capacitance 163. This reduces the manufacturing steps required to produce the electro-absorption modulator section 112. It is additionally conceivable that the driver-side voltage source 132 ($V_{TWA}$) is dispensed with.

Figure 8:
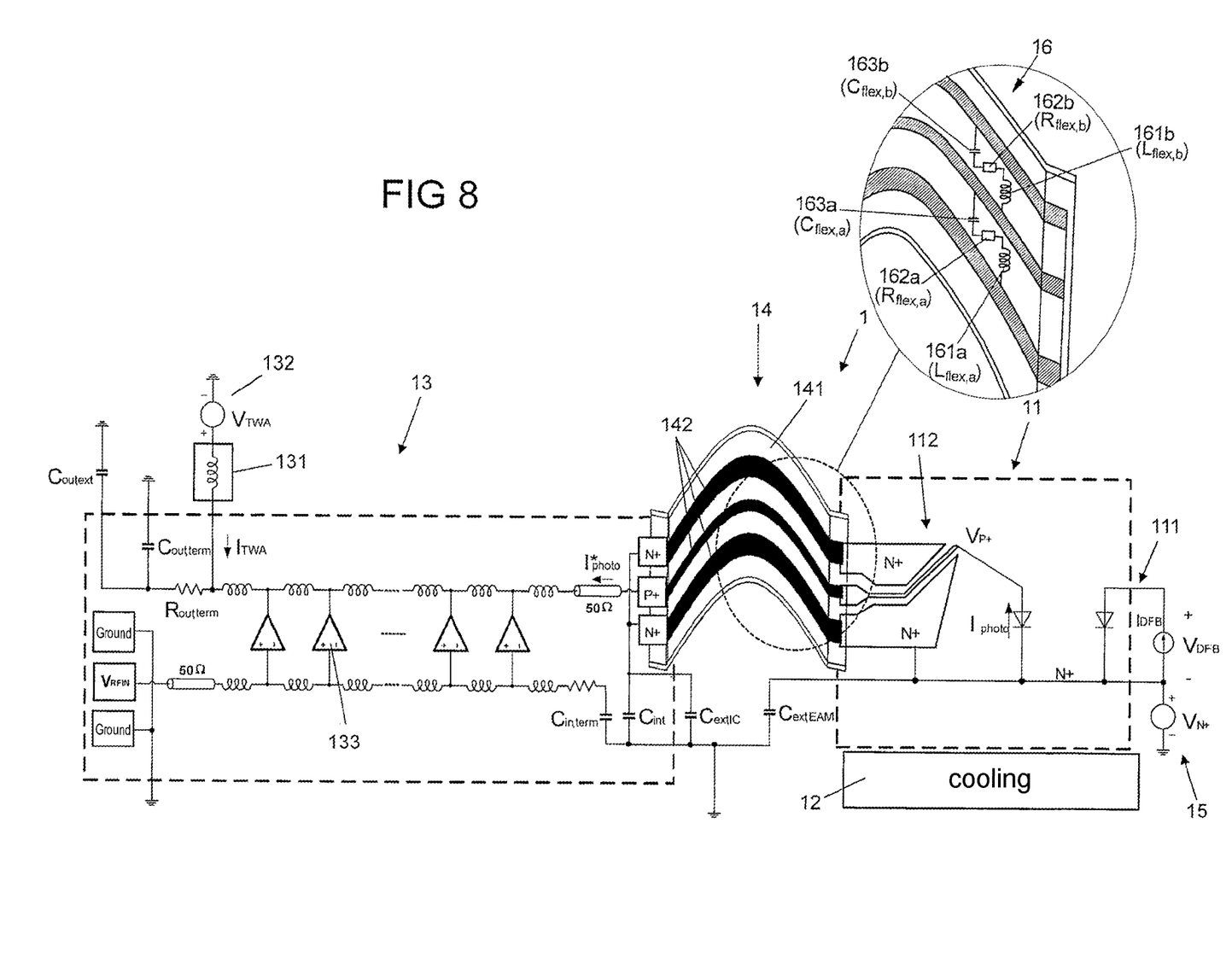
FIG. 8 shows a circuit diagram of a laser arrangement according to a fifth embodiment.

FIG. 8 relates to a further variant of the laser arrangement 1 according to the solution, according to which the impedance adaptation circuit 16 is not formed as a termination impedance circuit but is integrated in the electrical connection 14, which is formed as a flexible line. Accordingly, adaptation inductances 161a, 161b ($L_{flex,a}$, $L_{flex,b}$), adaptation resistances 162a, 162b ($R_{flex,a}$, $R_{flex,b}$) and direct current blocking capacitances 163a, 163b ($C_{flex,a}$, $C_{flex,b}$) are arranged between the conductor tracks 142 of the electrical connection 14, in particular in the form of structures which are likewise arranged on the carrier 141 of the electrical connection 14 and here between the conductor tracks 142. It is conceivable that the photocurrent $I_{photo}$ generated is supported via the adaptation resistance 162. It is also possible that, with respect to the electrical connection 14, a potential is used (to which for example the external ones of the conductor tracks are connected) which is higher than the ground of the driver 13, and draining of part of the photocurrent via the adaptation resistance 162 is thus counteracted.

Among the inductance, resistance and capacitance structures $L_{flex,a}$, $L_{flex,b}$, $R_{flex,a}$, $R_{flex,b}$, $C_{flex,a}$, $C_{flex,b}$ in each case one is situated between two adjacent conductor tracks 142, wherein the structures together produce a total adaptation inductance, a total adaptation resistance and a total blocking capacitance. The inductance, resistance and capacitance structures $L_{flex,a}$, $L_{flex,b}$, $R_{flex,a}$, $R_{flex,b}$, $C_{flex,a}$, $C_{flex,b}$ are located on a half, which faces the laser 11 (in particular the electro-absorption modulator section 112), of the electrical connection 14 (in particular in the region of an end of the electrical connection 14 facing the electro-absorption modulator section 112).

Figure 9:
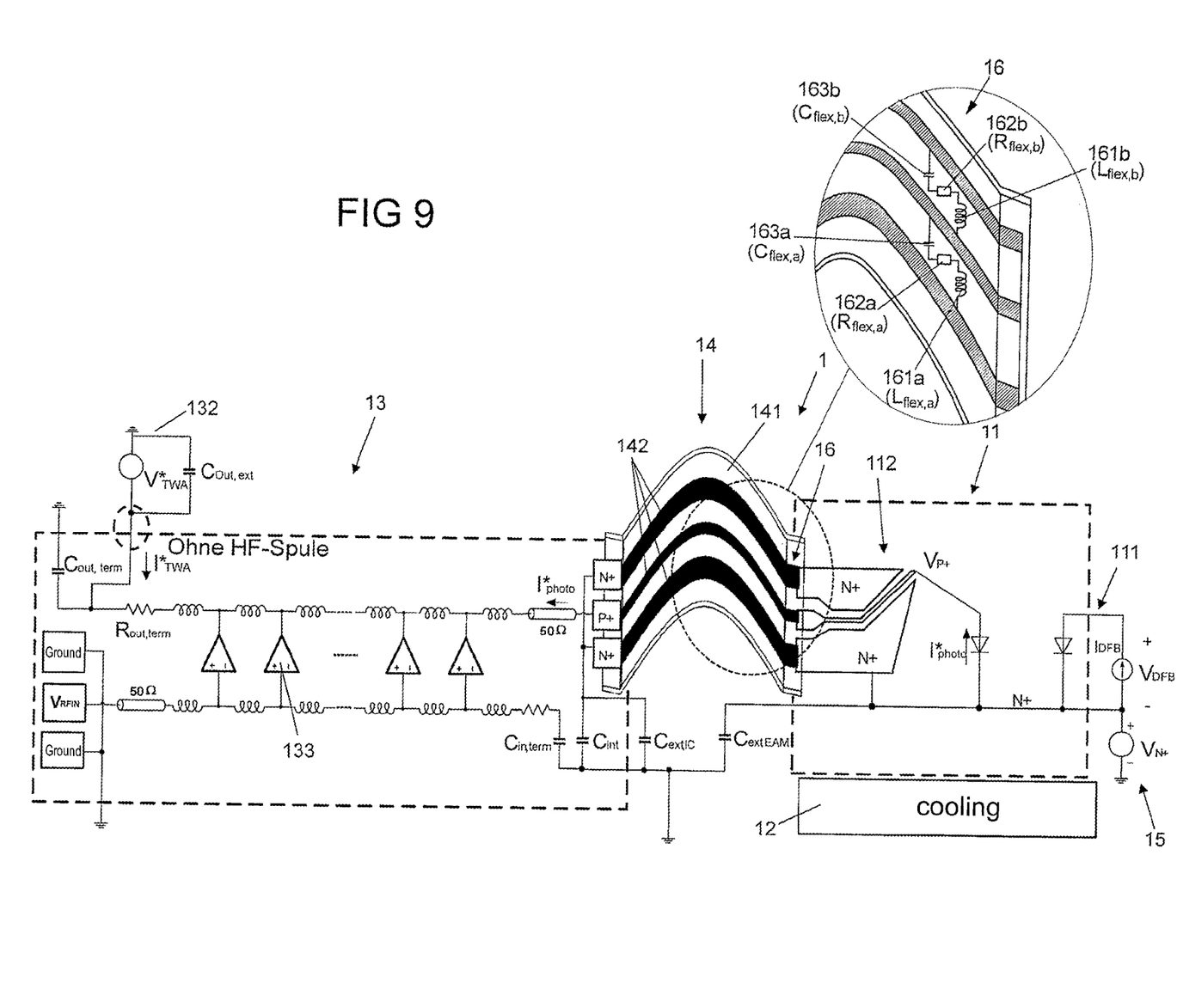
FIG. 9 shows a circuit diagram of a laser arrangement according to a sixth embodiment.

The embodiment of FIG. 9 corresponds to that of FIG. 8, but wherein the RF termination coil 131 that is coupled to the driver 13 is dispensed with. Accordingly, a supply voltage $V^*_{TWA}$ is supplied here to the traveling wave amplifier using a parallel capacitance $C_{out, ext}$ via an adaptation resistance $R_{out, term}$. The capacitance $C_{out,ext}$ together with a further capacitance $C_{out,term}$ realizes a broadband RF connection of the adaptation resistance $R_{out,term}$ to ground. The energy saving for the supply of the drive is determined by $V^*_{TWA} \times I^*_{photo}$, wherein $V^*_{TWA} = V_{TWA} + R_{out,term} \times I^*_{TWA}$, $I_{TWA} = I_{TWA}$.

Figure 10:
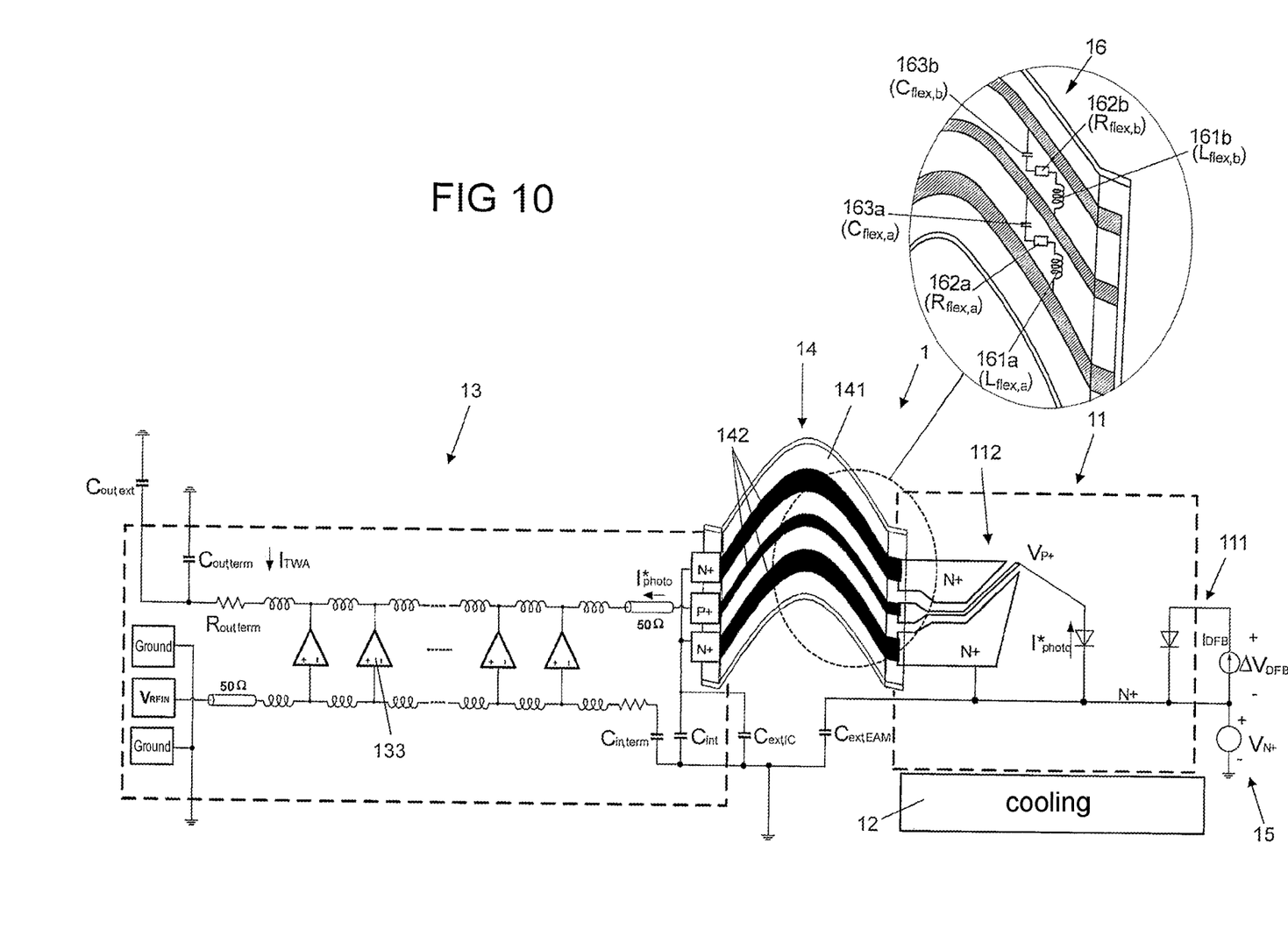
FIG. 10 shows a circuit diagram of a laser arrangement according to a seventh embodiment.

According to the embodiment of FIG. 10, the separate voltage source 132 for the additional supply of the driver 13 is also dispensed with; that is to say the driver 13 is supplied solely by way of the photocurrent generated in the electroabsorption modulator section 112 of the laser 11, wherein optionally in addition to the photocurrent the current flowing through the resistance $R_{flex}$ can serve for supplying the driver 13. It is conceivable herefor that the capacitance $C_{flex}$ is dispensed with.

It is pointed out that elements of the embodiments described above can of course also be used in combination with one another. The solution is furthermore, as already mentioned above, not limited to a hybrid construction of the laser arrangement. In particular, the above-described embodiments can similarly also be realized with a monolithic construction of the laser arrangement.

The invention claimed is:

1. A laser arrangement, having:
   an electro-absorption-modulated laser, having a laser section and an electro-absorption modulator section;
   a current source for supplying the laser section with current; a DC voltage source that is arranged in addition to the current source and can be used to apply DC voltage to a diode structure of the electro-absorption modulator section; a driver with which an RF signal is able to be fed to the laser; an electrical connection via which the driver is connected to the laser,
   wherein the electrical connection provides a direct current connection between the driver and the laser and the driver is configured such that a photocurrent that is generated in the electrode-absorption modulator section of the laser by illumination with light of the laser section at least partially flows to the driver and at least contributes to the energy supply of the driver.

2. The laser arrangement as claimed in claim 1, wherein the electrical connection also provides an RF connection between the driver and the laser.

3. The laser arrangement as claimed in claim 2, wherein the electrical connection is an impedance-adapted line.

4. The laser arrangement as claimed in claim 1, wherein the driver is a single-ended amplifier.

5. The laser arrangement as claimed in claim 4, wherein the RF signal is able to be supplied to the driver by virtue of a temporally varying potential being applied to an input of the driver, wherein the RF signal is produced as difference of the varying potential with a temporally substantially constant reference potential.

6. The laser arrangement as claimed in claim 1, wherein the driver is configured such, and connected to the laser such, that at least one of:
   the driver is able to be supplied with energy exclusively by way of the photocurrent generated in the electro-absorption modulator section of the laser, and
   the driver retains its amplification properties if it is supplied with energy exclusively by way of the photocurrent generated in the electro-absorption modulator section of the laser.

7. The laser arrangement as claimed in claim 1, wherein a current generated by the current source at least substantially does not flow into the driver.

8. The laser arrangement as claimed in claim 1, wherein no electrical connection exists between the current source and the electro-absorption modulator section or that an electrical connection which does not carry current during the operation of the laser arrangement is formed, in particular exclusively via at least one doped semiconductor layer of the laser.

9. The laser arrangement as claimed in claim 1, wherein no electrical connection exists between the current source and the driver or an electrical connection which does not carry current during the operation of the laser arrangement is formed, in particular exclusively via at least one doped semiconductor layer of the laser.

10. The laser arrangement as claimed in claim 1, wherein no electrical connection exists between the DC voltage source and the laser section or an electrical connection is formed exclusively via at least one doped semiconductor layer of the laser.

11. The laser arrangement as claimed in claim 1, wherein the energy supply of the driver is effected at least one of:
    mainly by way of the photocurrent produced in the electro-absorption modulator section of the laser, and
    at least substantially solely by way of the photocurrent produced in the electro-absorption modulator section of the laser.

12. The laser arrangement as claimed in claim 1, wherein the laser arrangement is configured such that at least substantially the entire photocurrent generated in the electro-absorption modulator section is used for the energy supply of the driver.

13. The laser arrangement as claimed in claim 1, wherein the driver is a traveling wave amplifier.

14. The laser arrangement as claimed in claim 1, further comprising an impedance adaptation circuit having an adaptation inductance, an adaptation resistance and/or a direct current blocking capacitance.

15. The laser arrangement as claimed in claim 14, wherein at least one of:
    the impedance adaptation circuit does not have a direct current blocking capacitance,
    the impedance adaptation circuit is part of the laser and
    the impedance adaptation circuit is integrated in the electrical connection.

16. The laser arrangement as claimed in claim 1, wherein the driver, the electrical connection and the laser are monolithically integrated.

17. The laser arrangement as claimed in claim 1, wherein the electrical connection is formed by a flexible line.

18. The laser arrangement as claimed in claim 1, further comprising a thermoelectric cooling apparatus for cooling the electro-absorption modulated laser.

19. An array having a plurality of laser arrangements as claimed in claim 1.

20. A method for producing a laser arrangement having the steps:
    providing an electro-absorption-modulated laser, having a laser section and an electro-absorption modulator section;
    providing a current source for supplying the laser section with current and an additional DC voltage source that is arranged in addition to the current source and can be used to apply DC voltage to a diode structure of the electro-absorption modulator section;
    providing a driver with which an RF signal is able to be fed to the laser;
    producing an electrical connection between the driver and the laser, wherein the laser arrangement is configured such that the electrical connection provides a direct current connection between the driver and the laser such that a photocurrent that is generated in the electrode-absorption modulator section of the laser by illumination with light of the laser section at least partially flows to the driver and at least contributes to the energy supply of the driver.

* * * * *